(12) United States Patent
Harris et al.

(10) Patent No.: US 11,251,316 B2
(45) Date of Patent: Feb. 15, 2022

(54) PHOTOVOLTAIC CELL ENERGY HARVESTING FOR FLUORESCENT LIGHTS

(71) Applicant: University of South Carolina, Columbia, SC (US)

(72) Inventors: Tyler Harris, Kershaw, SC (US); Myron Jackson, Columbia, SC (US)

(73) Assignee: University of South Carolina, Columbia, SC (US)

( * ) Notice: Subject to any disclaimer, the term of this patent is extended or adjusted under 35 U.S.C. 154(b) by 650 days.

(21) Appl. No.: 15/695,158

(22) Filed: Sep. 5, 2017

(65) Prior Publication Data

US 2018/0351008 A1 Dec. 6, 2018

Related U.S. Application Data

(60) Provisional application No. 62/515,072, filed on Jun. 5, 2017.

(51) Int. Cl.
*H01L 31/02* (2006.01)
*H02J 7/00* (2006.01)
(Continued)

(52) U.S. Cl.
CPC .... *H01L 31/02021* (2013.01); *H01M 10/465* (2013.01); *H02J 7/0068* (2013.01); *H02J 7/35* (2013.01)

(58) Field of Classification Search
CPC . H01J 61/02; H01L 31/02021; H01M 10/465; H02J 7/0068; H02J 7/35; H02S 40/34
(Continued)

(56) References Cited

U.S. PATENT DOCUMENTS 4,673,928 A * 6/1987 Guim .................. H02H 3/046
250/554
5,482,570 A   1/1996 Saurer et al.
(Continued)

FOREIGN PATENT DOCUMENTS

| JP | S 60195979 | 10/1985 |
|----|------------|---------|
| JP | S 62198169 | 9/1987  |
| JP | S 62247574 | 10/1987 |

OTHER PUBLICATIONS

Krishna, C. Mandal. Lecture Slides. "The Operation of solar Cell", web Apr. 6, 2016. < https://blackboard.sc.edu/bbcswebdav/pid-9407011-dt-content-rid-20296954_2/courses/ELCT510-001-SPRING-2016/ELCT510_Lecture11_Solar_Cell_Operation_II.pdf > (Secure Website).
(Continued)

*Primary Examiner* — Daniel Kessie
*Assistant Examiner* — Brian K Baxter
(74) *Attorney, Agent, or Firm* — Dority & Manning, P.A.

(57) ABSTRACT

Modern living involves using a significant amount of energy, much of which may be wasted or not used efficiently. This apparatus and methodology focuses on potentially wasted energy that is being produced but unused by fluorescent lights in buildings. Wasted energy is harvested using photovoltaic cell technology. Energy harvested per presently disclosed subject matter may be used for other local electrical devices, or sent back into the grid for the building to use, or stored for later use. One of the local uses may include an associated wireless device to send information to a cell phone and stored locally on a computer. Energy harvesting circuitry disclosed herewith is both compact and low cost.

4 Claims, 10 Drawing Sheets

(51) Int. Cl.
*H02J 7/35* (2006.01)
*H01M 10/46* (2006.01)

(58) Field of Classification Search
USPC .......................................................... 307/19
See application file for complete search history.

(56) References Cited

U.S. PATENT DOCUMENTS

| | | | | |
|---|---|---|---|---|
| 5,583,402 | A * | 12/1996 | Moisin | H05B 41/3927 315/307 |
| 5,633,565 | A * | 5/1997 | Friedman | F21S 9/037 315/200 A |
| 8,264,613 | B2 | 9/2012 | Harris et al. | |
| 8,970,161 | B1 * | 3/2015 | Cuadros | H02M 3/33584 320/101 |
| 9,473,230 | B2 | 10/2016 | Anders et al. | |
| 9,780,602 | B2 * | 10/2017 | Tuerk | H05B 47/19 |
| 2006/0007549 | A1 * | 1/2006 | Zincone | E04D 13/033 359/591 |
| 2007/0012349 | A1 * | 1/2007 | Gaudiana | G06Q 30/00 136/244 |
| 2007/0032762 | A1 * | 2/2007 | Vogel | A61M 1/0031 604/305 |
| 2009/0079412 | A1 * | 3/2009 | Kuo | H01L 31/02021 323/299 |
| 2009/0085512 | A1 * | 4/2009 | Liang | H02J 7/0044 320/101 |
| 2010/0096000 | A1 * | 4/2010 | Andrade | F21S 9/037 136/246 |
| 2011/0089886 | A1 * | 4/2011 | Dubovsky | H02J 7/35 320/101 |
| 2011/0205705 | A1 * | 8/2011 | Graybill | H05K 7/20745 361/696 |
| 2014/0334192 | A1 * | 11/2014 | Meyer | H02M 3/33584 363/21.01 |
| 2016/0020728 | A1 * | 1/2016 | Wolter | H02J 7/35 307/66 |
| 2017/0237283 | A1 * | 8/2017 | Davidovich | H02J 7/35 307/24 |
| 2017/0331322 | A1 * | 11/2017 | Tuerk | H02J 1/10 |
| 2018/0212551 | A1 * | 7/2018 | Polk | H02S 20/32 |
| 2018/0238563 | A1 * | 8/2018 | Stepa | F24D 19/1057 |
| 2019/0189695 | A1 * | 6/2019 | Niiyama | F21S 9/02 |
| 2019/0222028 | A1 * | 7/2019 | Dibachi | H02J 7/35 |

OTHER PUBLICATIONS

Krishna, C. Mandal. Lecture Slides. "The Operation of solar Cell", web Apr. 6, 2016. <https://blackboard.sc.edu/bbcswebdav/pid-9407021-dt-content-rid-20296955_2/courses/ELCT510-001-SPRING-2016/ELCT510_Lecture12_Solar_Cell_Operation_III.pdf > (Secure Website).

Krishna, C. Mandal. Lecture Slides. "The Operation of solar Cell", web Apr. 6, 2016. <https://blackboard.sc.edu/bbcswebdav/pid-9422639-dt-content-rid-20483792_2/courses/ELCT510-001-SPRING-2016/ELCT510_Lecture13_Solar_Cell_Operation_IV.pdf > (Secure Website).

Lending, Jamie. "This Fully Transparent Solar Cell Could Make Every Window and Screen a Power Source (updated)." *ExtremeTech*, Ziff Davis, Apr. 20, 2015, Web. Oct. 22, 2016.

Wright, M. "Spark Photon: A $19 kit for building your products," *Insider*, 2014. <https://thenextweb.com/insider/2014/11/12/spark-photon-19-kit-building-wi-fi-enabled-products/#.tnw_mFvbdlX5>.

Arduino. "Ardnino WiFi Shield 101" *adafruit* (2015) pp. 1-2.

Coliz, Jr., J. "helloworld_tx.pde"*RF24Network* v.1 (2011). http://maniacbug.github.io/RF24Network/helloworld_tx_8pde-example.html.

Cook, D. "Simple Solar Power Circuit with Rechargeable Battery Backup" *Robot Room* pp. 1-10.

DRAGINO. "Dragino Yun Shield" v.1 (2014) pp. 1-32.

Drew, J. "Energy Harvester Produces Power from Local Environment, Eliminating Batteries in Wireless Sensors" *Linear Techn.* DN483 (2010) pp. 1-2.

Electronics Tutorials. "555 Oscillator Tutorial" (2015).

Espressif Systems. "ESP8266EX Datasheet" *adafruit* v.4.3 (2015) pp. 1-31.

Evanczuk, S. "Specialized ICs, PV Cells Enable Energy Harvesting from Indoor Lighting" *Digi-Key Elect.* (2015) pp. 1-4.

Ge. "T8 LongLast™ Linear Fluorescent Lamps" *GE Lighting* (2013) pp. 1-4.

IDTECHEX. Energy Harvesting Report 2012-2022, 2017-2018. *IDTechEx*.

Kim, et al. "Fluorescent light energy harvesting using a capacitive touch screen" *Electr. Lett.* 51(21) (2015) pp. 1695-1697.

Limpkin. "Indoor solar energy harvesting: a platform to (finally) get some numbers" *limpkin blog* (2011) pp. 1-9.

Liu, et al. "An 86% Efficiency 12 μW Self-Sustaining PV Energy Harvesting System With Hysteresis Regulation and Time-Domain MPPT for IOT Smart Nodes" *IEEE J. Sol.-State Circ.* 50(6) (2015) pp. 1424-1437.

Moghimi, R. "Curing Comparator Instability with Hysteresis" *Anal. Dialog.* 34(7) (2000) pp. 1-3.

Monti, et al. "Energy Harvesting of Spurious Emissions of Compact Fluorescent Lamps for Home Monitoring Applications" IEEE (2014) pp. 1-4.

Nettigo. "Connecting and programming nRF24L01 with Arduino and other boards" *Starter Kit* (2014).

Ohms Law Calculator. "555 Astable Circuit Calculator" *Zero Point Labs* (2014). (Web only) http://www.ohmslawcalculator.com/555-astable-calculator.

Osoyoo. "ESP8266 UART WiFi Shield" (2015).

Panasonic™, "Panasonic™ BR1225A Lithium Poly-Carbonmonofluoride Battery".

Panasonic™. "Panasonic™ BR2032-1HF 3V Lithium Coin Cell Battery 2 Pins".

Panasonic™. "Panasonic™ VL2320-1HF 3V Lithium Rechargeable Coin Cell Battery".

Particle. Particle Device Firmware (2016) (Web only) https://docs.particle.io/reference/firmware/photon/#tcpserver.

Particle. "Photon" *Particle docs* V016 (2015) pp. 1-33.

Stoimenov, G.G. "Comparator Provides Adjustable Hysteresis Window" *Elect. Desig.* 59(9) (2011) p. 83.

TI. "Indoor Light Energy Harvesting Reference Design for Bluetooth® Low Energy (BLE) Beacon Subsystem" *Texas Instrum.* (2014) pp. 1-40.

TI. "LMC7660 Switched Capacitor Voltage Converter" (2013) pp. 1-21.

Yu, et al. "Indoor Micro-Light Energy Harvesting System for Low Power Wireless Sensor Node" (2010) pp. 1-4.

* cited by examiner

| | light watts | Current | Voltage | Watts captured | Percent |
|---|---|---|---|---|---|
| Fluorescent | 100 | 4.62E-02 | 10 | 4.62E-01 | 4.62E-03 |
| | 25 | 3.10E-03 | 7.9 | 2.45E-02 | 9.80E-04 |
| | 15 | 6.70E-03 | 8.6 | 5.76E-02 | 3.84E-03 |
| | 8 | 2.33E-03 | 7.76 | 1.81E-02 | 2.26E-03 |
| Average | | 1.46E-02 | 8.565 | 1.41E-01 | 2.93E-03 |

FIG. 7

| Resistance (Ω) | Current (A) | Voltage (V) |
|---|---|---|
| 100 | 1.74E-02 | 1.9 |
| 1000 | 8.72E-03 | 8.8 |
| 10000 | 9.00E-04 | 9.18 |
| 100000 | 9.00E-05 | 9.26 |
| 1000000 | 1.00E-05 | 9.29 |

FIG. 8

PHOTOVOLTAIC CELL ENERGY HARVESTING FOR FLUORESCENT LIGHTS

PRIORITY CLAIM

This application claims the benefit of previously filed U.S. Provisional Patent Application entitled "PHOTOVOLTAIC CELL ENERGY HARVESTING FOR FLUORESCENT LIGHTS," assigned U.S. Ser. No. 62/515,072, filed Jun. 5, 2017, and which is incorporated herein by reference for all purposes.

STATEMENT REGARDING FEDERALLY SPONSORED RESEARCH OR DEVELOPMENT

The presently disclosed subject matter was made without government support.

BACKGROUND OF THE PRESENTLY DISCLOSED SUBJECT MATTER

The presently disclosed subject matter generally relates to energy efficiency, and more particularly to harvesting wasted energy from fluorescent lights, for other effective uses. In some instances, harvested energy may be used to power circuits, for example, for displaying sensor data.

The law of conservation of energy states that the total amount of energy in a system remains constant and that the total energy cannot be created or destroyed but can change into different or new forms of energy. When energy is changed into a different form, it is sometimes at least partially wasted because there isn't an appropriate system in place to do anything with, or to make use of, the energy in its changed form. Accordingly, one desire would be to focus on harnessing wasted energy in some such circumstances.

While use generally of a photovoltaic cell to harvest light energy is known, most of such uses are only tailored to outside use. As known, solar panels are primarily put on the outside of buildings and houses to harness light energy coming from the sun in order to power electrical devices inside the building or house. For example, FIG. 1 is a schematic representation of an exemplary embodiment of a prior art installation of a solar panel arrangement, used for charging a battery and/or otherwise supplying a load. More specifically, rays from the sun generally 10 impinge on the solar panel generally 12, the output of which is connected by representative wires 14 and 16. In turn, a connector/controller device generally 18 shows blue output wires 20 and 22 connected to a charging battery 24. As will be understood by those of ordinary skill in the art, additional features such as an IRF540 power MOSFET generally 26, diode 28, loads 30 and 32 (such as resistors), and sensor element 34 (such as touch screen technology) may be variously associated with the power source connector 18 via battery 24 and further lines 36 through 50, as shown. As will also be understood by those of ordinary skill in the art, such prior art arrangement of FIG. 1 may be practiced with additional features not represented. For example, such FIG. 1 solar panel 12 may be associated with an MPPT (maximum power point tracking) circuit in order to track the sun and to physically angle the solar cell to a specific angle to be able to obtain the highest light absorption rate possible at any time of day.

One known product by Linear Technology Corporation uses a circuit to harness the surrounding electric field around a fluorescent light and convert that energy into a regulated output.

Another known product that harnesses wasted energy (by Ulsan National Institute of Science and Technology) is one that uses a capacitive touch screen instead of a photovoltaic cell. A capacitive touch screen part of a touch screen cell phone can be used to harness the power of ambient noise from fluorescent lights. Looking at such approach, it takes in the ambient noise of fluorescent lights at about 50 kHz. Some of the advantages of using the capacitive touch screen is that it is relatively small and has both a low pass filter and antenna that will be used with it, i.e. the human body. The way this works is that the user is closer to the ambient noise in question than the device and therefore acts as an antenna. While the noise passes through the body, it is slightly filtered and transferred directly to the device when the user touches it with their finger, thus completing the parallel plate capacitor between the copper traces and the user's finger. However, such technology doesn't work as well when the capacitive touch screen is not being touched.

While such alternative approaches to harvesting energy specifically from a fluorescent light environment, none of such products are harnessing the actual light coming from fluorescent light.

The photovoltaic cell is a device that has been created to turn solar or light energy into electrical power. In general, photovoltaic cells produce direct current so that it has the ability to power equipment or batteries. The photovoltaic cells typically need to be protected so they are usually packed behind a thin sheet of glass. A single photovoltaic cell doesn't ordinarily have the ability to create enough power to turn on an electrical device. For such reason, cells are generally put together to create a solar panel. The devised solar panel is then used in a larger system as an energy source.

SUMMARY OF THE PRESENTLY DISCLOSED SUBJECT MATTER

In general, it is a present object to provide improved energy efficient arrangements, and associated methodology. It is a more particular object, in some instances, to provide an improved harvesting of wasted energy from fluorescent lights, for other effective uses. In some instances, harvested energy may be used to power circuits, for example, for displaying sensor data.

It is also a present object to provide for harvesting relative to indoor florescent lights so that wasted light energy can be used to energize other devices in the room depending on the output power obtained from a provided energy harvesting circuit.

It is also a present object to provide devices which are compact and low cost as possible while providing a photovoltaic cell as a main source of harvesting ambient energy from an associated fluorescent light.

In some present embodiments, the presently disclosed subject matter makes use in part of a photovoltaic cell arrangement to harvest wasted light energy of an indoor florescent light or lights. Such harvested light energy may be used in some presently disclosed embodiments to power subsystems of the harvesting circuit along with a set of batteries used as a storage element. In some such instances, for example, batteries storing harvested light energy and the storage element of the circuit will run for up to 12 hrs.

In other presently disclosed aspects, positioning of the photovoltaic cell may be taken into consideration when harvesting the maximum amount of wasted light energy available.

In some aspects, the presently disclosed subject matter makes use of a photovoltaic cell as a first part of an energy harvesting device, having a purpose of harvesting wasted energy from fluorescent lights and using the harvested energy to power a circuit that displays an associated sensor, such as showing humidity and temperature on a cellular device. Modern living involves using a significant amount of energy, much of which may be wasted or not used efficiently. This apparatus and methodology focuses on potentially wasted energy that is being produced but unused by florescent lights in buildings. Wasted energy is harvested using photovoltaic cell technology. Energy harvested per presently disclosed subject matter may be used for other local electrical devices, or sent back into the grid for the building to use, or stored for later use. One of the local uses may include an associated wireless device to send information to a cell phone and stored locally on a computer. Energy harvesting circuitry disclosed herewith is both compact and low cost.

One presently disclosed exemplary embodiment of the presently disclosed subject matter relates to an energy harvesting apparatus. Such apparatus preferably may comprise at least one photovoltaic cell, providing an output; at least one energy storage medium; at least one associated device load; and a controller. Such controller is preferably for controllably directing such photovoltaic cell output between such energy storage medium and such associated device load, such that such controller has an on duty cycle for such associated device load of less than 50 percent.

In some variations of the foregoing energy harvesting apparatus, such associated device load may comprise a sensor circuit. In some such variations, such associated device load may further comprise a Wi-Fi communication device associated with such sensor circuit, for making data from such sensor circuit available via Wi-Fi enabled communications.

In other variations of the foregoing exemplary energy harvesting apparatus, such photovoltaic cell may be associated with an indoor fluorescent light, for harvesting wasted light energy from such light. In some of those variations, and in others, such energy storage medium may comprise rechargeable batteries and/or such controller may comprise a timer chip operating in astable mode. For some such alternatives, such timer chip may further include a pair of diodes associated with the trigger, threshold, and discharge functions thereof, so as to relatively reduce the resulting duty cycle of such timer chip.

In yet other alternatives of the foregoing energy harvesting apparatus, a voltage divider circuit may be provided between such photovoltaic cell output and such controller, for limiting the voltage level from such photovoltaic cell output. In some such alternatives, such voltage divider circuit may comprise a resistor divider circuit across such photovoltaic cell output.

In still other presently disclosed variations of the foregoing exemplary energy harvesting apparatus, such controller duty cycle may be in a range of from about 10 percent to about 1 percent. For others, such controller duty cycle may be about 10 percent or less; such photovoltaic cell may be associated with an indoor fluorescent light, for harvesting wasted light energy from such light; such energy storage medium may comprise rechargeable batteries; and such associated device load may comprise a sensor circuit and an associated Wi-Fi communication device for making data from such sensor circuit available via Wi-Fi enabled communications. Further, such apparatus may also further comprise a voltage divider circuit between such photovoltaic cell output and such sensor circuit, for limiting the voltage level from such photovoltaic cell output to such sensor circuit.

It is to be understood that the presently disclosed subject matter equally relates to associated and/or corresponding methodologies. One exemplary such method relates to methodology for operating an energy harvesting apparatus. Such method preferably comprises providing at least one photovoltaic cell, situated relatively adjacent a light source, and having an output; providing at least one energy storage medium and at least one device load; and controllably directing the photovoltaic cell output between the energy storage medium and the associated device load so that the duty cycle for directing the photovoltaic cell output to the associated device load is less than 50 percent. In variations of such methodology, the method may further include mounting the at least one photovoltaic cell relatively adjacent an indoor fluorescent light for gathering wasted light energy therefrom.

In other alternatives of such exemplary methodology, the storage medium may comprise rechargeable batteries; and the associated device load may comprise a sensor circuit and associated Wi-Fi communications device, for transmitting data from the sensor circuit. Per other alternatives of such presently disclosed methodology, controllably directing the photovoltaic cell output may include limiting the voltage level therefrom, and limiting the duty cycle for directing the photovoltaic cell output to the associated device load to a 10 percent or less duty cycle. In other of such variations, the duty cycle may be in a range of from about 10 percent to about 1 percent.

For other variations of the subject presently disclosed methodology, the duty cycle for directing the photovoltaic cell output to the associated device load may be about 10 percent or less; the photovoltaic cell may be associated with an indoor fluorescent light, for harvesting wasted light energy from such light; the energy storage medium may comprise rechargeable batteries; the associated device load may comprise a sensor circuit and an associated Wi-Fi communication device for transmitting data from the sensor circuit; and the methodology may further comprise providing a voltage divider circuit between the photovoltaic cell output and the sensor circuit, for limiting the voltage level from the photovoltaic cell output to the sensor circuit.

Yet another presently disclosed exemplary embodiment of methodology relates to a method for harvesting wasted light energy from a fluorescent light. Such method preferably comprises providing at least one photovoltaic cell, situated relatively adjacent a fluorescent light source, and having an output; providing at least one energy storage medium; providing at least one device load comprising a sensor circuit and associated Wi-Fi communications device, for transmitting data from the sensor circuit; providing a voltage divider circuit for limiting the voltage level from the photovoltaic cell output; and controllably directing the output of the voltage divider circuit between the energy storage medium and the associated device load so that the duty cycle for directing such output to the associated device load is about 10 percent or less.

In some variations of the foregoing exemplary method, the fluorescent light source may be indoors; and the storage medium may comprise rechargeable batteries. For others thereof, the duty cycle may be in a range of from about 10 percent to about 1 percent.

Additional objects and advantages of the presently disclosed subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments, uses, and practices of the presently disclosed subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the presently disclosed subject matter may include various combinations or configurations of presently disclosed features, steps, or elements, or their equivalents (including combinations of features, parts, or steps or configurations thereof not expressly shown in the figures or stated in the detailed description of such figures). Additional embodiments of the presently disclosed subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification, and will appreciate that the presently disclosed subject matter applies equally to corresponding methodologies as associated with practice of any of the present exemplary devices, and vice versa.

BRIEF DESCRIPTION OF THE FIGURES

A full and enabling disclosure of the presently disclosed subject matter, including the best mode thereof, to one of ordinary skill in the art, is set forth more particularly including the specification, and including reference to the accompanying figures in which:

FIG. 7 is a tabular representation of sample data collected in an exemplary embodiment in accordance with the presently disclosed subject matter;

FIG. 8 is a tabular representation of resulting current and voltage output data collected for an exemplary embodiment in accordance with the presently disclosed subject matter;

Figure 1:
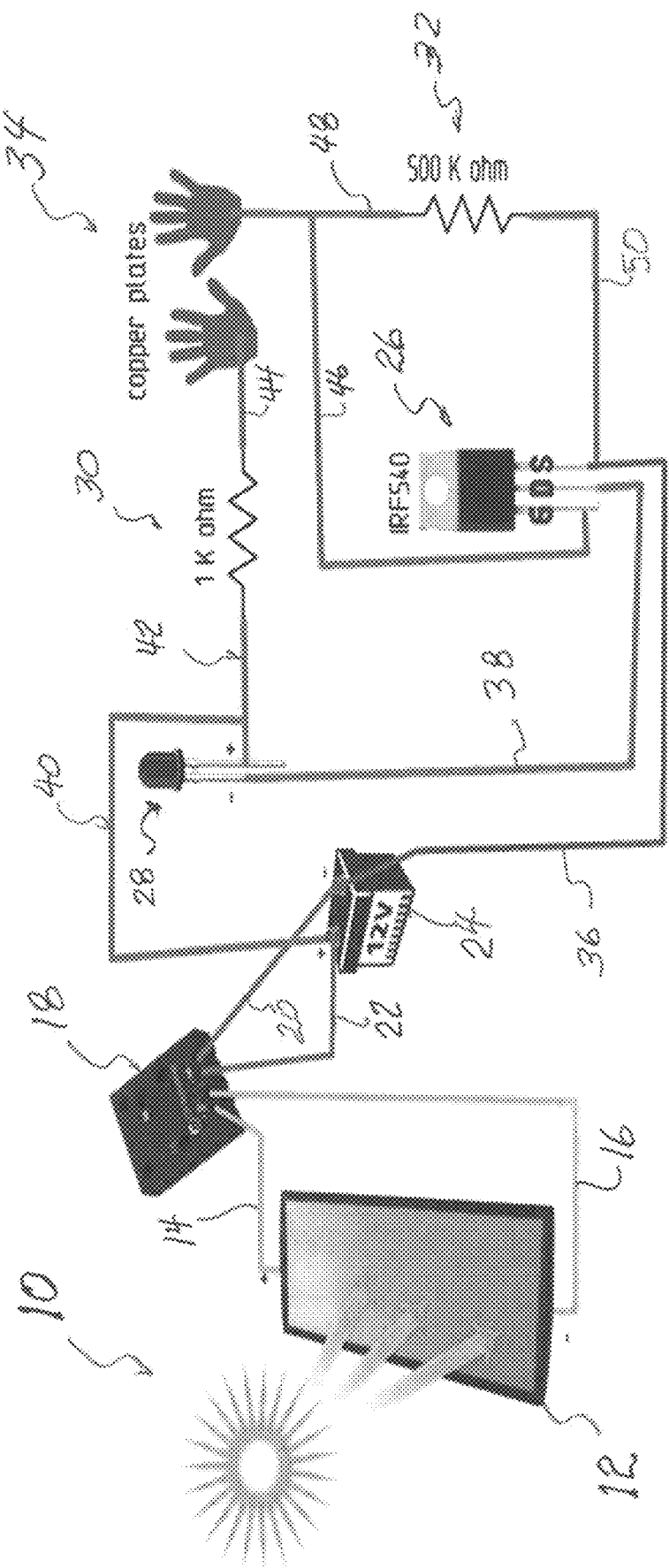
FIG. 1 is a schematic representation of an exemplary embodiment of a prior art installation of a solar panel arrangement, used for charging a battery and/or otherwise supplying a load.

Repeat use of reference characters in the present specification and drawings is intended to represent the same or analogous features or elements or steps of the presently disclosed subject matter.

DETAILED DESCRIPTION OF THE PRESENTLY DISCLOSED SUBJECT MATTER

Reference will now be made in detail to various embodiments of the presently disclosed subject matter, one or more examples of which are set forth below. Each embodiment is provided by way of explanation of the subject matter, not limitation thereof. In fact, it will be apparent to those skilled in the art that various modifications and variations may be made in the presently disclosed subject matter without departing from the scope or spirit of the subject matter. For instance, features illustrated or described as part of one embodiment, may be used in another embodiment to yield a still further embodiment, and corresponding and/or associated methodologies may be practiced relative to apparatus disclosed and/or suggested herewith, all of which comprise various embodiments of the presently disclosed subject matter.

Figure 2:
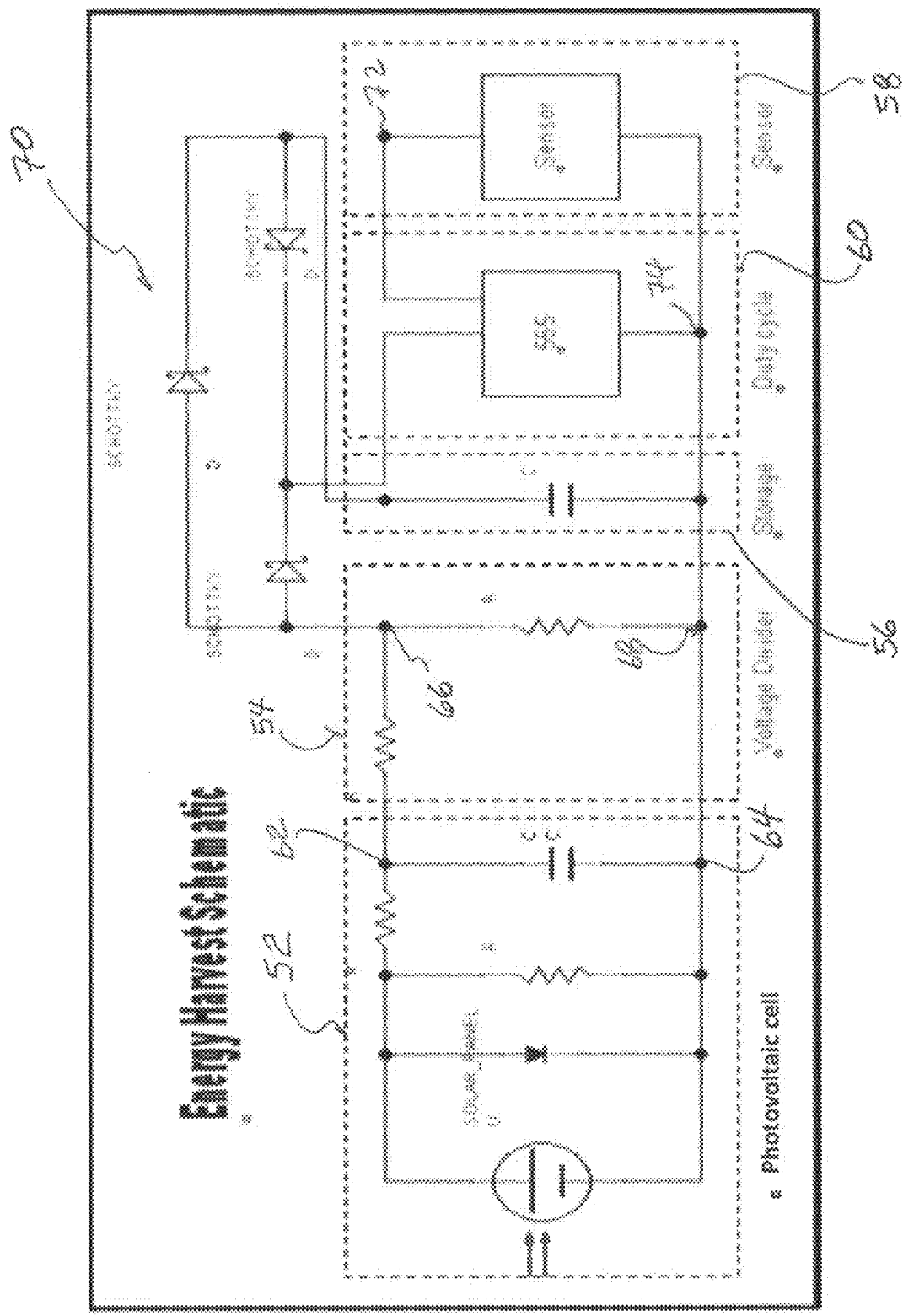
FIG. 2 is a schematic of an exemplary embodiment of the presently disclosed energy harvesting subject matter.
Figure 3:
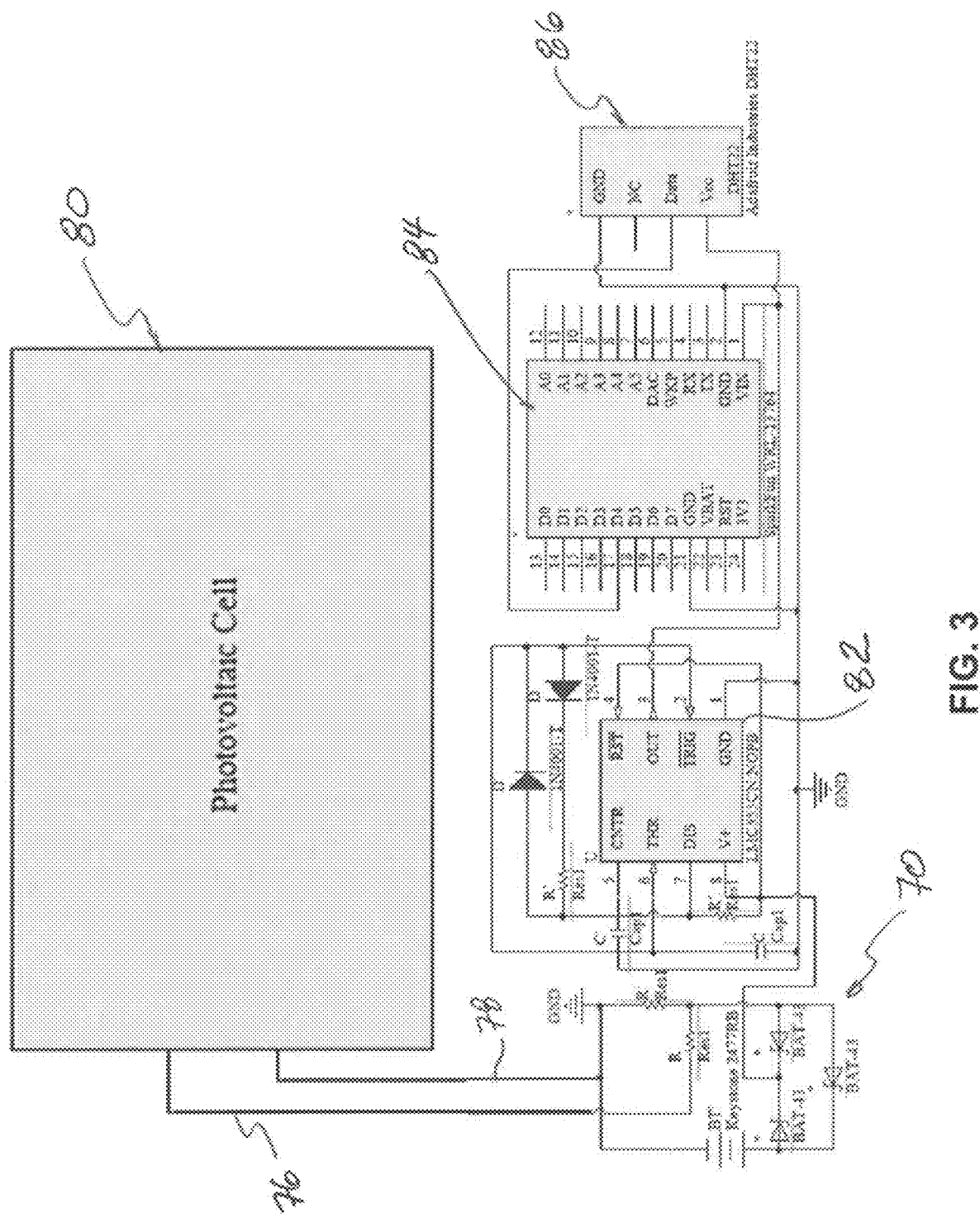
FIG. 3 is another schematic of an exemplary embodiment of the presently disclosed energy harvesting subject matter.

In general, FIG. 2 is a schematic of an exemplary embodiment of the presently disclosed energy harvesting subject matter. Similarly, FIG. 3 is another schematic of an exemplary embodiment of the presently disclosed energy harvesting subject matter.

The FIG. 2 schematic of a presently disclosed subject matter energy harvesting device generally shows various assembled components, represented in part by dotted line illustrations. Specifically, a photovoltaic cell is generally represented within dotted line box 52, while a voltage divider per box 54, a storage component per box 56 and a load component (exemplary sensor representation) per box 58 are shown, along with a duty cycle component per box 60. The duty cycle component (an LM555 chip) and the sensor component (a wireless sensor module) are represented in block diagram form in FIG. 2 for simplicity.

The photovoltaic cell generally 52 takes in light energy and powers the rest of the exemplary circuit. The maximum voltage output of the cell can be over 7 volts depending on how much light it is absorbing at a given point in time. The complete illustrated features of the exemplary photovoltaic cell 52 include generally the indicated solar panel feature, with associated diode, resistors and capacitors forming outputs from box 52 at respective nodes 62 and 64.

Such photovoltaic cell output nodes 62 and 64 in turn form input nodes for voltage divider 54, represented by a simple two-resistor divider network, the particulars of which are well known to those of ordinary skill in the art, in order to adjust relative outputs across output nodes 66 and 68 thereof as needed for a particular implementation. In one presently preferred exemplary embodiment, the voltage divider features 54 may comprise a safety measure to make sure that the output voltage of the photovoltaic cell is not greater than 5.5 volts. In this exemplary instance, the maximum voltage that the exemplary wireless sensor module 58 can handle is 5.5 volts.

The represented storage unit generally 56 that is being used in this exemplary embodiment is a battery pack that holds four lithium alkaline batteries (such as size "AA").

The representative LM555 chip is used to make a duty cycle feature 60 where the wireless sensor is preferably on for approximately one minute and then off for nine minutes. The Schottky diodes (generally 70) are arranged in a way such that the output nodes 72 and 74 of duty cycle feature 60 cycles powering the wireless sensor module 58 between the photovoltaic cell 52 and the storage unit 56.

In an exemplary embodiment, sensor unit 58 may comprise a Spark Photon device (a Wi-Fi modular device) which has an operational voltage of 3.3-5.5 volts. Such a device has wireless capabilities and can connect to the local Wi-Fi, to be monitored by a computer or smart phone that is also connected to the same network. Such integrated arrangement contributes to certain aspects of functionality of some embodiments of the presently disclosed subject matter because it avoids having to check data for the Spark Photon manually (which would require physically retrieving the device from its operative position, such as in the ceiling, and then re-placing it once checked.

The FIG. 3 schematic of a presently disclosed subject matter energy harvesting device generally shows various arranged components, represented in part with chip pin connection features.

In particular, outputs 76 and 78 of representative photovoltaic cell 80 are associated with four "AA" batteries and battery holder (such as a Keystone 2477RB), which with representative Schottky diodes generally 70 (such as BAT-43 small signal Schottky diodes) serve as inputs to LM55 chip generally 82. One example of the LM555 duty cycle control chip 82 is an LMC555CNN/NOPB. Preferably, per the currently disclosed subject matter, such chip 82 is associated with two additional diodes, as illustrated, and as discussed in greater detail with reference to FIG. 4 herewith.

As shown per application FIG. 3, output pin 3 and ground pin 1 of chip 82 are associated with VIN pin 1 and ground pins 2 and 21 of the Spark Photon chip generally 84. The Spark Photon device 84 as discussed above is generally a Wi-Fi modular device, such as the SparkFun WRL-13764. Further, for operational purposes, it may be advantageously associated with an Adafruit Industries DHT22 chip generally 86, as shown. Such chip 86 comprises a form of temperature-humidity sensor portion of the sensor 58 feature represented by application FIG. 2. Other types and/or brands of sensors may be practiced in accordance with the broader aspects of the presently disclosed subject matter.

Figure 4:
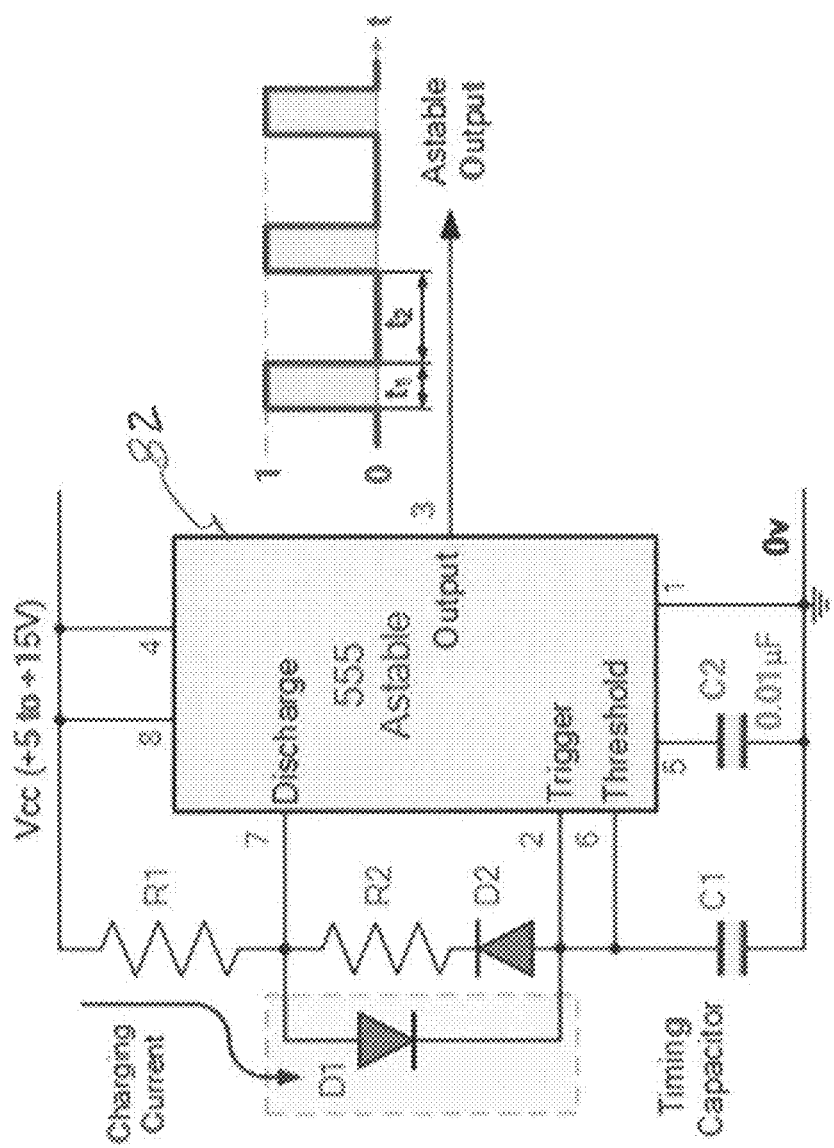
FIG. 4 is a schematic of a portion of an exemplary embodiment of the presently disclosed energy harvesting subject matter, focused on duty cycle aspects thereof.

FIG. 4 is a more detailed schematic of duty cycle aspects of an exemplary embodiment of the presently disclosed energy harvesting subject matter.

More particularly, the representative chip 82 of application FIG. 3 is shown in a configuration with two added diodes D1 and D2. By connecting such D1 between the trigger input pin 2 and the discharge input pin 7 of chip 82, the timing capacitor C1 of application FIG. 4 will charge up directly through R1 because R2 is shorted out by the diode D1. As will be understood by those of ordinary skill in the art from the complete disclosure herewith, D2 can be connected in series with the discharge resistor R2 if required to ensure that the timing capacitor C1 will only charge up through D1 and not through the parallel path of R2 because the charging process diode D2 is connected in reverse bias blocking the flow of current through itself.

Such associated circuit arrangements with the duty cycle circuit advantageously provide a timing of approximately one minute on and nine minutes off. If the otherwise normally occurring configuration of a duty cycle circuit were used, it would be impossible to obtain such desired timing because the normal version wouldn't allow under a 50% duty cycle to be achieved. The right hand side illustration of application FIG. 4 represents a duty cycle of under 50%, as achievable per such presently disclosed subject matter.

Figure 5:
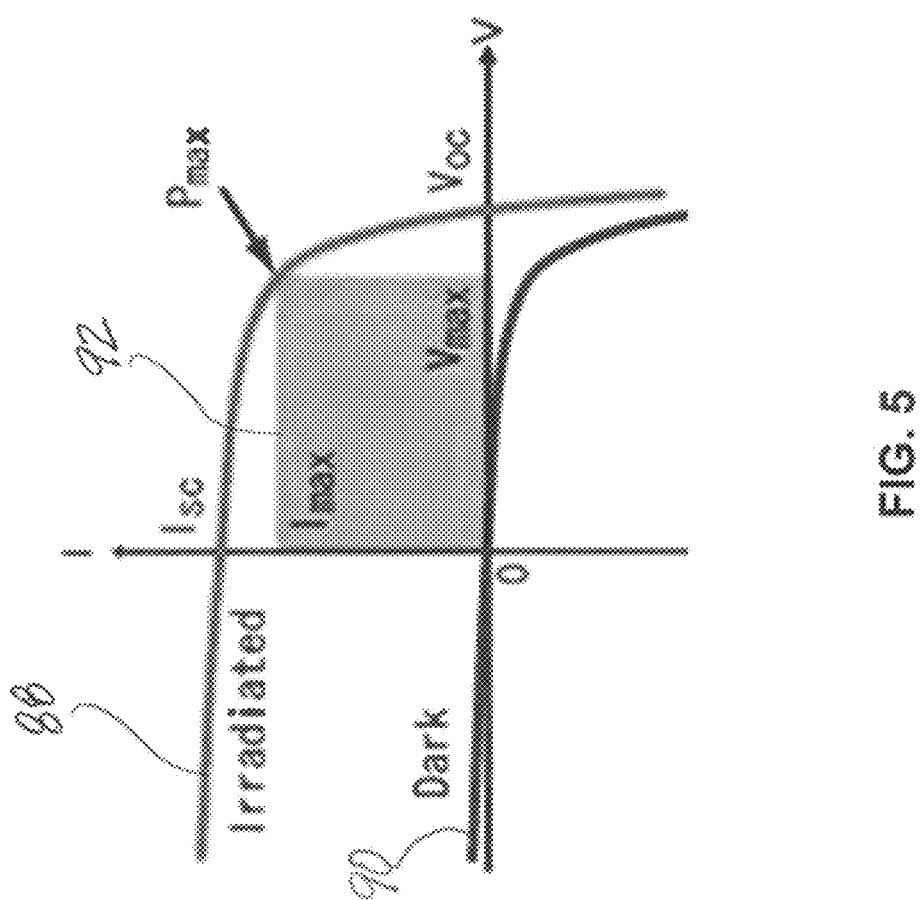
FIG. 5 is a representative graph illustrating performance of a representative photovoltaic device in light and dark environments.

FIG. 5 is a representative graph which illustrates in general the performance of a representative photovoltaic device in light and dark environments. The respective graph curves 88 and 90 on FIG. 5 show the max power that can be obtained when the photovoltaic cell is being illuminated (curve 88) as well as when the cell is not being illuminated (curve 90). Curves 88 and 90 are understood to be idealized (calculated) curves, as opposed to realistic representation of a cell's actual characteristics. The yellow box 92 is a more realistic representation of what the real current and voltage max would end up being during implementation and utilization. Equation 1 herewith shows a calculation for maximum current, while Equation 2 herewith shows a calculation for maximum voltage.

$$I_m = -I_{ph}\left(1 - \frac{kT}{qV_m}\right) \quad \text{Equation 1}$$

Calculation for Max Current $$V_m \approx V_{OC} - \frac{kT}{q}\ln\left(1 + \frac{qV_{OC}}{kT}\right) \quad \text{Equation 2}$$

Calculation for Max Voltage

In calculating the maximum current using Equation 1 above, $-I_{ph}$ (photocurrent) is equal to the short circuit current. kT/q is equal to 0.026 at 300° K (where k is the Boltzmann Constant in Joules per Kelvin, T is the temperature, and q is the charge of an electron) and $V_m$ is the max voltage. This in turn means that Equation 2 shows how to calculate the maximum voltage where $V_{oc}$ is the open circuit voltage and kT/q is equal to 0.026 at 300° K (again, where k is Boltzmann Constant in Joules per Kelvin, T is the temperature, and q is the charge of an electron).

Figure 6:
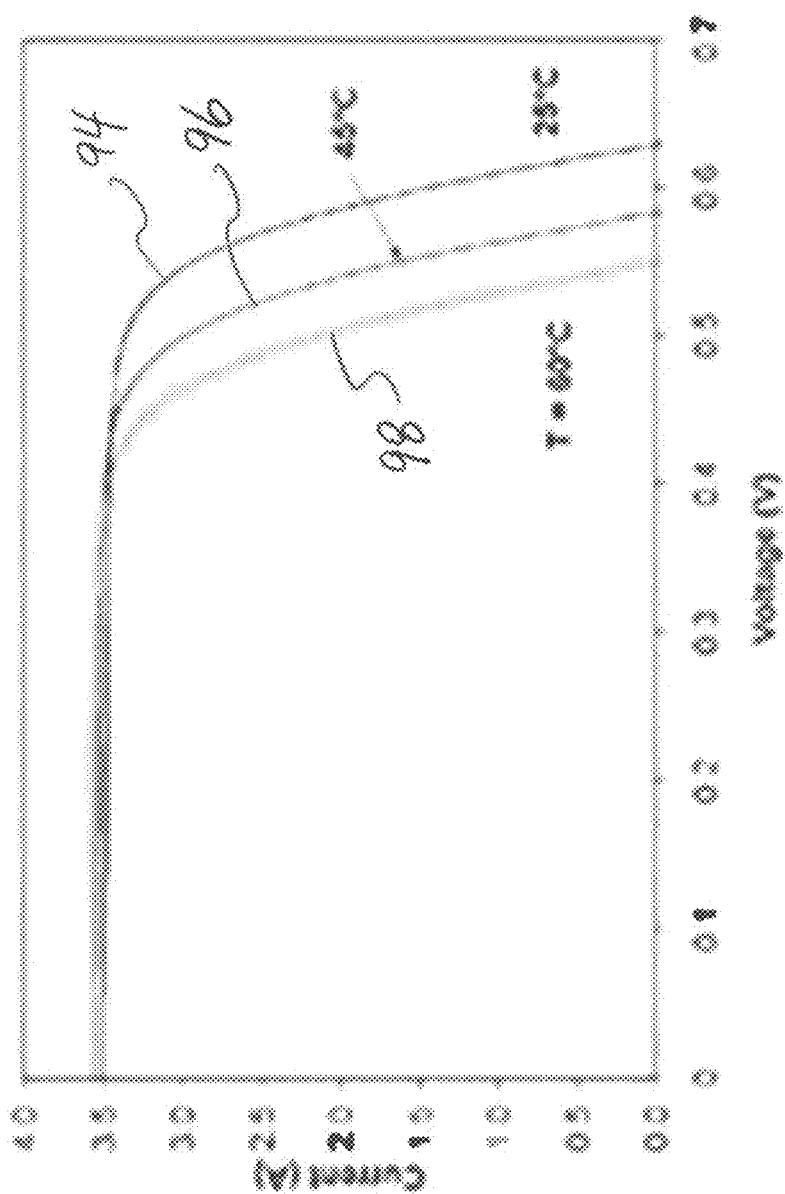
FIG. 6 is a representative graph illustrating performance of a representative photovoltaic device in different temperature environments.

FIG. 6 is a representative graph illustrating the general performance of a representative photovoltaic device in different temperature environments. Stated another way, FIG. 6 shows three different representations (graph curves 94, 96, and 98) of the Current-Voltage characteristics of an exemplary photovoltaic cell, based upon the varying temperatures of 25, 45 and 60° C., respectively. As shown, the current stays roughly the same at the beginning but drops closer to the end (right-hand side of the curve). The voltage becomes less the higher the temperature gets. From the graph of FIG. 6, it is possible to conclude that a photovoltaic cell becomes less efficient when it is exposed to higher temperatures. Depending upon the output power of a particular photovoltaic cell being used in an implementation in accordance with the presently disclosed subject matter, a voltage divider (as otherwise discussed herein) may need to be used to ensure that an associated load (such as a wireless node) is not overpowered. All such variations as may be practiced by those of ordinary skill in the art whenever practicing the presently disclosed technology are intended to come within the spirit and scope of the presently disclosed subject matter.

FIG. 7 is a tabular representation of sample data collected in an exemplary embodiment in accordance with the presently disclosed subject matter. In particular, the table shows data results from an exemplary photovoltaic cell while varying light wattages. As will be understood by those of ordinary skill in the art from the complete disclosure herewith, the tabular columns for "Current", "Watts captured", and "Percent" are expressed in scientific notation.

As represented, for the subject exemplary photovoltaic cell, it was first tested using different varieties of lights with varying wattages. As shown per FIG. 7, the ratings on each of the lights were 100, 25, 15, and 8 watts, respectively. The exemplary photovoltaic cell was then set up in both open and short circuit conditions in order to get both the voltage and current values. As will be understood, this means that the resulting power values were also determined, based on such determined voltage and current values. As shown per FIG. 7, average current of the varying wattages of light was shown to be 14.6 mA while the average voltage was shown to be 8.565 volts. As a result, that means that the average wattage was determined as being 0.141 watts.

Figure 9:
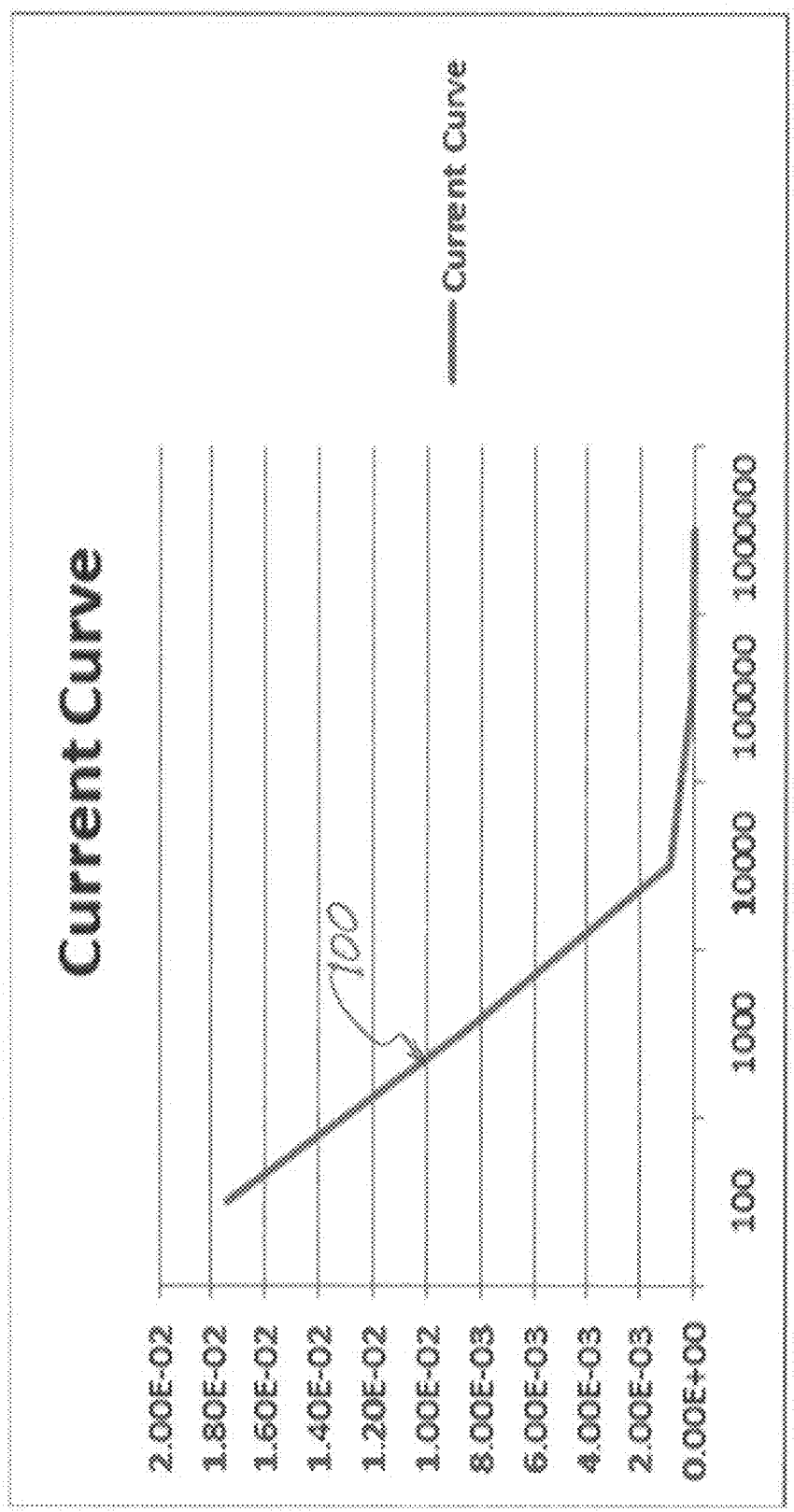
FIG. 9 is a graphic plot specifically of the current curve portion of the current output data as associated with the table of FIG. 8.
Figure 10:
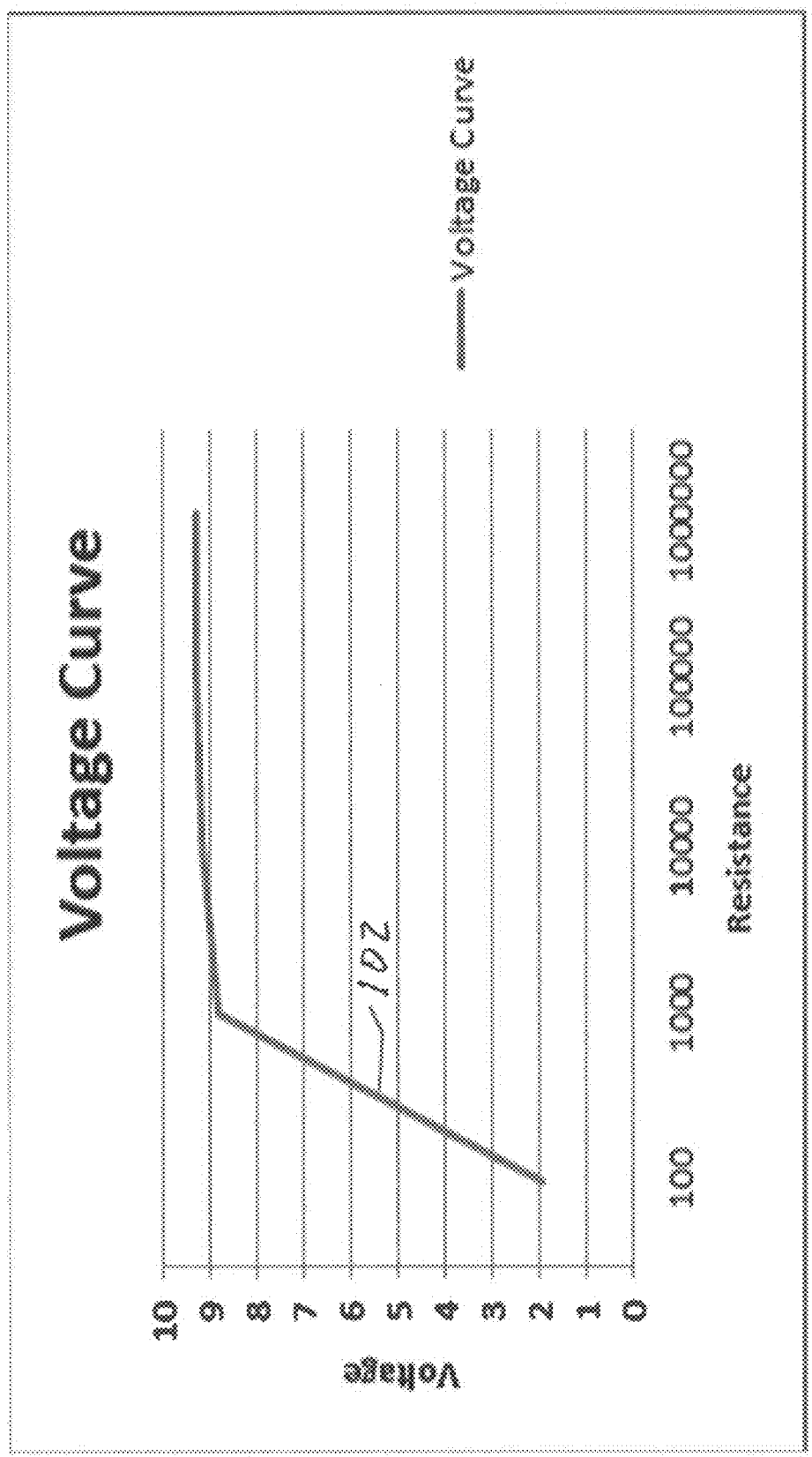
FIG. 10 is a graphic plot specifically of the voltage curve portion of the voltage output data as associated with the table of FIG. 8.

The next step from a testing perspective for the subject exemplary embodiment of the presently disclosed subject matter was to determine current and voltage output curves responsive to varying load resistances. FIG. 8 is a tabular representation of the resulting current and voltage output data collected in an exemplary embodiment in accordance with the presently disclosed subject matter. FIG. 9 is a graphic plot specifically of the current curve portion of such data as associated with the table of FIG. 8, while FIG. 10 is a graphic plot specifically of the voltage curve portion of such data as associated with the table of FIG. 8. Again, as will be understood from the complete disclosure herewith, the "Current" column of the table in FIG. 8 shows resulting amps in scientific notation.

The respective load resistors that were used for the subject phase of testing were 100 Ω, 1 KΩ, 10 KΩ, 100 KΩ, and 1 MΩ resistors. In order to determine the resulting current data of the subject exemplary photovoltaic cell, a multimeter was placed in series with each of the respective different resistors (resistive loads) and data points were then taken with the results as shown the in middle column of FIG. 8, and per the current curve 100 of FIG. 9. In determining respective voltage data points for the subject exemplary photovoltaic cell, a multimeter was placed in parallel with each of the respective different load resistors, with the results as shown in the right hand column of FIG. 8, and per the voltage curve 102 of FIG. 10.

As shown by the current curve 100 of FIG. 9, as the load resistance is increased, the short circuit current decreases greatly until such current begins to level out at about 10 KΩ. However, the opposite observation can be said for the voltage output, which as shown by voltage curve 102 of FIG. 10 increases as the resistance is increased and then begins to level out at around 1 KΩ. Comparing such test results with the general graph representations of application FIG. 6 otherwise discussed herein shows that the test results generally follow the expected curve and the theory of the photovoltaic cell operating characteristics. It will be understood that more detailed characteristic curves could be obtained for any given implementation of the presently disclosed subject matter by simply taking more data points using more resistors in between the resistor values that are already being represented. It would be expected that any such additional graphing would result generally in more smooth representation of the photovoltaic cells characteristics.

As understood from the foregoing disclosure, after the output of the photovoltaic cell (and in some exemplary embodiments, after use of a voltage divider), the output voltage may be processed through a series of diodes that then determine whether the storage element (for example, in some instances, NiMH rechargeable AA batteries) or the solar panel is going to power an associated device and charge the batteries based upon the voltage of each.

When it comes to the timing of when the storage elements are charging, the subject representative 555 timer is preferably used in its astable mode. As understood by those of ordinary skill in the art, whenever a 555 timer is operative in its astable mode, the circuit takes an input DC voltage and adapts it to be an oscillating square wave. The equation for finding the charging time (with reference to FIGS. 2, 3, and 4) is shown by Equation 3 herewith, and the duty cycle of such resulting square wave may be calculated using Equation 4 herewith.

As further understood, the threshold of the timer is a comparator that compares ⅓ of the $V_{cc}$ (or V+; pin 8) with the threshold's input and feeds it into a flip-flop reset input when the capacitor voltage passes ⅔ $V_{cc}$. In such case, the discharge transistor will be closed. When the capacitor discharges below ⅓ $V_{cc}$, the flip-flop is set and the output goes high. The ratio of time and period is called duty cycle (as notes by the mathematical expression in Equation 4 herewith. With the type of 555 oscillator circuit shown in FIGS. 2, 3, and 4 herewith, and per the presently disclosed subject matter, the duty cycle needs to be less than 50% and only be active for a short period of time to conserve energy. To do so, a circuit in accordance with the presently disclosed subject matter is provided as represented in FIGS. 2 and 3 herewith but with the additional diode and related circuitry as discussed in detail with reference to application FIG. 4. When using such circuit in accordance with the presently disclosed subject matter, the resulting duty cycle is able to be decreased to less than 50%, and in some instances to about 10% or in some other instances even to about 1%. Equations 5 and 6 show how values are determined per such FIG. 4 specific embodiment.

$$T = 0.693(R_1 + R_2) * C \quad \text{Equation 3: Equation for Finding Charging Time}$$

$$\text{Duty Cycle} = (R_1 + R_2)/(R_1 + 2R_2) \quad \text{Equation 4: Equation for Duty Cycle}$$

Per FIG. 4 herewith, when adding a diode in parallel with R2 as well as from pin connection 2 of the 555 chip going toward R2 in series (FIG. 4), the circuit's characterization changes as follow:

$$T = 0.693(R_1 + R_2) * C \quad \text{Equation 5: Equation for Finding New Charging Time}$$

$$\text{Duty Cycle} = R_1/(R_1 + R_2) \quad \text{Equation 6: Equation for New Duty Cycle}$$

Generally speaking, wireless sensor modules are modules that are capable of collecting, processing, and communicating information with other modules (sometimes also referenced as nodes) that are also within its network. Such modules are nodes are a beneficial aspect of some embodiments of the presently disclosed subject matter, and per such embodiments they allow users to be able to make sure the energy harvesting circuit is working as a whole. Such optional usage also allows users to obtain information (data) from the harvesting device (or devices) while it is use instead of having to stop the device or devices and collect data manually.

As otherwise referenced herein, various wireless devices may be practiced in various embodiments of the presently disclosed subject matter, with one exemplary embodiment involving the so-called Particle Photon (which also can act as a microcontroller and can be programmed using widely practiced Arduino code).

Generally speaking, radio signals are what make Wi-Fi networking possible. Wi-Fi receivers are used to receive a signal from radio signals that have been transmitted from Wi-Fi antennas. As understood, examples of such receivers can be found in a multitude of devices including computers and phones. Whenever a device receives a signal, a connection is made wirelessly and the device is connected to the internet. Access points, which consist of both antennas and routers, are two of the main sources that transmit radio waves that can be used to connect devices to the internet. Antennas are typically stronger, have a longer radio transmission with a general radius of about 300-500 feet and are usually used in public areas. For the purpose of home connection, weaker yet effective routers are often used and have an effective range of about 100-150 feet depending upon the type of router used. As generally known, the most common specification for Wi-Fi is 802.11b with the 802.11g standard being compatible with 0.11b (though 802.11a has a different frequency and requires different hardware than 0.11b).

As otherwise referenced herein, a completed energy harvesting circuit and associated technology may be provided in accordance with the presently disclosed subject matter. When rechargeable NiMH batteries are used, they may be charged during the resting stage of the duty cycle for the energy harvesting circuit and the Particle Photon. Variations may be practiced, including those which make use of better, more efficient components as they become available, such as better photovoltaic cells or solar panels that don't hinder the amount of light that is coming from an associated fluorescent light. For example, it is contemplated that developments in solar panel technology may provide for a panel that is completely transparent as a transparent photovoltaic cell, or in some instances is a transparent luminescent solar concentrator. Using such technology, it would be potentially possible to implement embodiments of the presently disclosed circuit and subject matter to power small electrical devices such as smartphones or tablets, allowing for a longer usage time in between charges with the possibility of eventually having a device that can run indefinitely without the use of a wall outlet.

Accordingly, the presently disclosed subject matter is generally different from other energy harvesting devices because it is primarily meant to harvest the ambient energy from an indoor light sources. Also using for example a Spark Photon device, the presently disclosed subject matter has the ability to connect directly to the user's smartphone to provide access to current data being sent from the Photon. In some implementations, the presently disclosed subject matter may be implemented in conjunction with a local server that provides for ready access to all the past data that the Spark Photon has obtained.

Also, as shown, many implementations of the presently disclosed subject matter can be practiced as relatively low cost, and with relatively smaller size that will not interfere with any other processes that it will be around. Specifically, because of its small size, it's easy to be maneuvered in existing installations, and then for its location to be changed as desired ore required. The network-based possibilities of the presently disclosed subject matter also allow for its association and/or practice with various smart phone applications, such as the smart phone app Blynk to make it easy to monitor the activity of an implemented embodiment.

While the presently disclosed subject matter has been described in detail with respect to specific embodiments thereof, it will be appreciated that those skilled in the art, upon attaining an understanding of the foregoing, may readily produce alterations to, variations of, and equivalents to such embodiments. Accordingly, the scope of the presently disclosed subject matter is by way of example rather than by way of limitation, and the subject disclosure does not preclude inclusion of such modifications, variations and/or additions to the presently disclosed subject matter as would be readily apparent to one of ordinary skill in the art.

What is claimed is:

1. A method for harvesting wasted energy from fluorescent light, comprising:
    providing at least one photovoltaic cell, situated relatively adjacent a fluorescent light, and having a voltage output;
    providing at least one energy storage medium;
    providing at least one device load comprising a sensor circuit and associated wireless communications device, for transmitting data from the sensor circuit;
    providing a voltage divider circuit for limiting the level of the voltage output level from the at least one photovoltaic cell, and having an output; and
    controllably directing the output of the voltage divider circuit between the at least one energy storage medium and the at least one device load using at least a timer chip with discharge and trigger input pins and pair of associated diodes with respective opposing biases, with one of said diodes directly connected between said timer chip discharge and trigger input pins and the other of said diodes directly connected to said trigger pin and connected to said discharge pin through a resistance, so that a duty cycle for directing the output of the voltage divider circuit to the associated device load is about 10 percent or less, with said duty cycle determined based at least in part on the voltage output of the at least one photovoltaic cell.

2. A method as in claim 1, wherein:
    the at least one device load comprises a sensor circuit and wireless communications device, for transmitting data from the sensor circuit.

3. A method as in claim 1, wherein:
    the fluorescent light is indoors; and
    the at least one energy storage medium comprises rechargeable batteries.

4. A method as in claim 1, wherein the duty cycle is in a range of from about 10 percent to about 1 percent.

* * * * *